United States Patent
Salimath et al.

(10) Patent No.: US 12,212,316 B1
(45) Date of Patent: Jan. 28, 2025

(54) SYSTEM AND METHOD FOR SYNTHETIC ANTIFERROMAGNET SKYRMION BASED LOGIC DEVICE

(71) Applicant: Ceremorphic, Inc., San Jose, CA (US)

(72) Inventors: Akshaykumar Salimath, Hyderabad (IN); Sanghamitra Debroy, Hyderabad (IN); Venkat Mattela, San Jose, CA (US)

(73) Assignee: CEREMORPHIC, INC., San Jose, CA (US)

(*) Notice: Subject to any disclaimer, the term of this patent is extended or adjusted under 35 U.S.C. 154(b) by 107 days.

(21) Appl. No.: 17/878,025

(22) Filed: Jul. 31, 2022

(51) Int. Cl.
| *H03K 19/18* | (2006.01) |
| *H03K 19/00* | (2006.01) |
| *B82Y 10/00* | (2011.01) |
| *B82Y 25/00* | (2011.01) |

(52) U.S. Cl.
CPC .............. *H03K 19/00* (2013.01); *B82Y 10/00* (2013.01); *B82Y 25/00* (2013.01)

(58) Field of Classification Search
CPC ......... B82Y 10/00; B82Y 25/00; H03K 19/00
See application file for complete search history.

(56) References Cited

U.S. PATENT DOCUMENTS

| 11,800,647 B1* | 10/2023 | Salimath .............. H05K 1/0296 |
| 2021/0104344 A1* | 4/2021 | Nguyen .............. H01F 10/3286 |

FOREIGN PATENT DOCUMENTS

| CN | 114744998 A * | 7/2022 | ............. H03K 19/18 |

* cited by examiner

*Primary Examiner* — Kurtis R Bahr
(74) *Attorney, Agent, or Firm* — Minisandram Law Firm; Raghunath S. Minisandram (57) ABSTRACT

A system and method for a logic device is disclosed. A plurality of synthetic antoferromagnet (SAF) nanotracks including a first input nanotrack, a second input nanotrack and an output nanotrack are disposed over a substrate along a first axis. Output nanotrack is disposed between the input nanotracks. Each nanotrack have a first end and a second end. A SAF connector nanotrack connects the first input nanotrack, the second input nanotrack, and the output nanotrack. An input value is defined at a first end of the input nanotracks by selectively nucleating a SAF skyrmion at the first end. Presence of the skyrmion is indicative of a first value and absence of the skyrmion indictive of a second value. A charge current is passed along the first axis to move nucleated skyrmion to the second end of the output nanotrack. Skyrmion at the output indicates an output value of the first value.

14 Claims, 5 Drawing Sheets

| | INPUT A | INPUT B | OUTPUT |
|---|---|---|---|
| | 0 | 0 | 0 |
| | 0 | 1 | 1 |
| | 1 | 0 | 1 |
| | 1 | 1 | 0 |

SYSTEM AND METHOD FOR SYNTHETIC ANTIFERROMAGNET SKYRMION BASED LOGIC DEVICE

RELATED APPLICATION

None

TECHNICAL FIELD

The present invention relates generally to logic devices and more specifically, to skyrmion based logic devices.

DESCRIPTION OF RELATED ART

The rapid development of information technology has ensured a continuous increase of the logic density over the past years. As the VLSI technology and associated CMOS based logic devices reach their limits, further increase in logic device density can only be accomplished through novel approaches.

Further, continued requirement for minimal power consumption in computing devices configured to use these devices and utilization of semiconductor technology to construct these devices are desirable for mass adaptation of these devices. With these needs in mind, the current disclosure arises. This brief summary has been provided so that the nature of the disclosure may be understood quickly. A more complete understanding of the disclosure can be obtained by reference to the following detailed description of the various embodiments thereof in connection with the attached drawings.

SUMMARY OF THE INVENTION

In one embodiment, a method is disclosed. A substrate is provided. A plurality of synthetic antoferromagnet (SAF) nanotracks including a first input nanotrack, a second input nanotrack and an output nanotrack are disposed over a substrate along a first axis. Output nanotrack is disposed between the input nanotracks. Each nanotrack have a first end and a second end. A SAF connector nanotrack connects the first input nanotrack, the second input nanotrack, and the output nanotrack. An input value is defined at a first end of the input nanotracks by selectively nucleating a SAF skyrmion at the first end. Presence of the SAF skyrmion is indicative of a first value and absence of the SAF skyrmion indictive of a second value. A charge current is passed along the first axis to move nucleated SAF skyrmion to the second end of the output nanotrack. The charge current is passed along the first axis. The presence of the SAF skyrmion is sensed about the second end of the output nanotrack. An output value is concluded as the first value when the presence of the SAF skyrmion is sensed.

In another embodiment, a system is disclosed. A substrate is provided. A plurality of synthetic antoferromagnet (SAF) nanotracks including a first input nanotrack, a second input nanotrack and an output nanotrack are disposed over a substrate along a first axis. Output nanotrack is disposed between the input nanotracks. Each nanotrack have a first end and a second end. A SAF connector nanotrack connects the first input nanotrack, the second input nanotrack, and the output nanotrack. An input value is defined at a first end of the input nanotracks by selectively nucleating a SAF skyrmion at the first end. Presence of the SAF skyrmion is indicative of a first value and absence of the SAF skyrmion indictive of a second value. A charge current is passed along the first axis to move nucleated SAF skyrmion to the second end of the output nanotrack. The charge current is passed along the first axis. The presence of the SAF skyrmion is sensed about the second end of the output nanotrack. An output value is concluded as the first value when the presence of the SAF skyrmion is sensed This brief summary is provided so that the nature of the disclosure may be understood quickly. A more complete understanding of the disclosure can be obtained by reference to the following detailed description of the preferred embodiments thereof in connection with the attached drawings.

BRIEF DESCRIPTION OF THE DRAWINGS

The foregoing and other features of several embodiments are described with reference to the drawings. In the drawings, the same components have the same reference numerals. The illustrated embodiments are intended to illustrate but not limit the invention. The drawings include the following figures.

DETAILED DESCRIPTION

To facilitate an understanding of the adaptive aspects of the present disclosure, an example logic device will be described. The specific construction and operation of the adaptive aspects of various elements of the example logic device is described.

Figure 1:
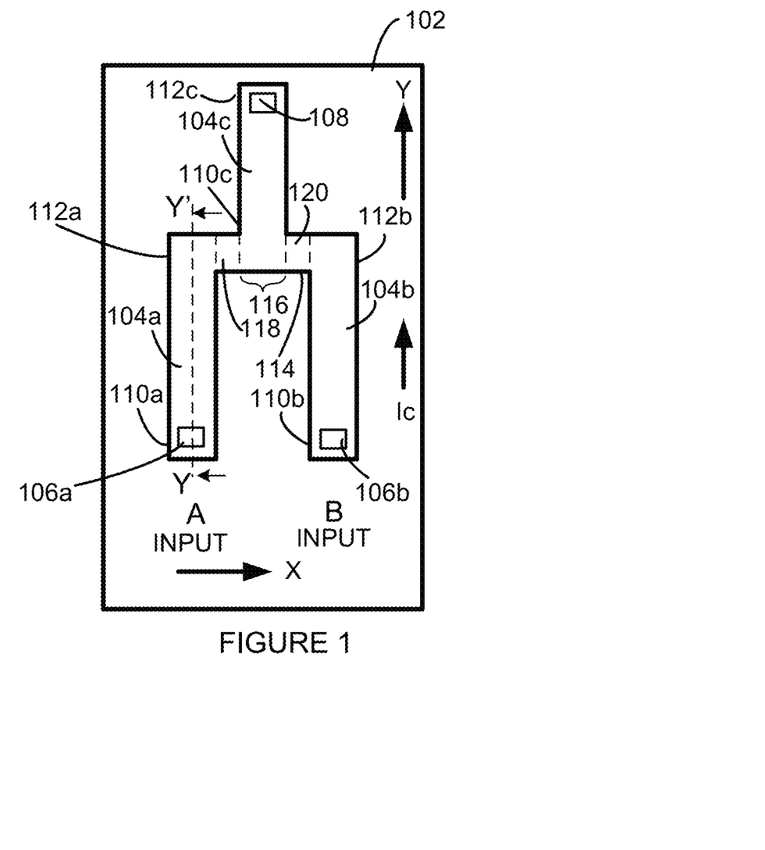
FIG. 1 shows an example logic device, according to one aspect of the present disclosure.

FIG. 1 shows an example logic device 100. The logic device 100 includes a substrate 102, a plurality of synthetic antiferromagnet (SAF) nanotracks 104a, 104b, and 104c, a SAF connector nanotrack 114, plurality of nucleating devices 106a, and 106b, and a sense device 108. The substrate 102 is a conductive metal layer. The substrate 102 is substantially made of heavy metal, such as Tantalum (Ta), Platinum (Pt), or Tungsten (W) or an alloy of heavy metal. In one example, the substrate 102 is a layer of thin film with a very large spin hall angle, such as a layer of thin film of Tantalum (Ta), Platinum (Pt), or Tungsten (W) or an alloy of Tantalum (Ta), Platinum (Pt), or Tungsten (W). The substrate 102 is configured to receive a charge current and convert the charge current into a spin current, through spin Hall effect. The thickness of the substrate 102 may be of the order of about 1 nm to about 3 nm. As one skilled in the art appreciates, the substrate 102 may be deposited on a base layer (not shown). In some examples, base layer may be a silicon wafer.

The plurality of SAF nanotracks 104a, 104b, and 104c are disposed over the substrate. The structure of the SAF nanotrack 104a will now be further described with reference to FIG. 1A, which shows the SAF nanotrack 104a along the line Y-Y'. Now, referring to FIG. 1A, a cross-sectional view of SAF nanotrack 104a along the line Y-Y' is shown. SAF nanotrack 104a includes a top layer 130, a bottom layer 132, and a spacer layer 134 disposed between the top layer 130 and the bottom layer 132. The bottom layer 132 is disposed over the substrate 102. The top layer 130 and the bottom layer 132 are composed of ferromagnetic material. In some examples, a suitable cobalt-nickel alloy or other similar materials (for example, nickel iron alloy, or cobalt, iron, nickel alloys) that provide high magnetic permeability may be used. The spacer layer 134 may be composed of a non-magnetic material like Ruthenium (Ru. The top layer 130, bottom layer 132 and the spacer layer 134 together form a synthetic antiferromagnet (SAF) nanotrack 104a. A thickness of the top layer 130 may be of the order of about 1 nm to about 2 nm. A thickness of the bottom layer 132 may be of the order of about 1 nm to about 2 nm. A thickness of the spacer later 134 may be of the order of about 0.5 nm to about 1 nm. In one example, the nanotracks 104b, 104c, and the connector nanotrack 114 are constructed similar to the construction of the nanotrack 104a.

In one example, the plurality of nanotracks 104a, 104b, and 104c are substantially rectangular in shape and are disposed substantially parallel to each other, along an axis Y. Each nanotrack has a first end and a second end. For example, nanotrack 104a has a first end 110a and a second end 112a. The nanotrack 104b has a first end 110b and a second end 112b. The nanotrack 104c has a first end 110c and a second end 112c. Nanotrack 104b is disposed between the nanotrack 104a and 104c. Sometimes nanotrack 104a is referred to as first input nanotrack 104a, nanotrack 104b is referred to as second input nanotrack 104b, and nanotrack 104c is referred to as output nanotrack 104c. The output nanotrack 104c is spaced apart and disposed about the second end 112a of the first input nanotrack 104a and the second end 112b of the second input nanotrack 104b. In one example, a width of the plurality of nanotracks 104a, 104b, and 104c is about 60-80 nanometers. Further, a space between the first input nanotrack and the second input nanotrack is about 80 nanometers. In one example, a thickness of the nanotrack is about 2.5-5 nanometers.

The connector nanotrack 114 is selectively disposed between the first input nanotrack 104a and the second input nanotrack 104b. The connector nanotrack 114 couples the second end 112a of the first input nanotrack 104a, first end 110c of the output nanotrack 104c and the second end 112b of the second input nanotrack 104b. As previously described, space between the first input nanotrack 104a and the second input nanotrack 104b is of the order of about 80 nanometers. The space between the first input nanotrack 104a and the second input nanotrack 104b results in a length of the connector nanotrack 114 in the order of about 80 nanometers. In one example, the width of connector nanotracks is of the order of about 60-80 nanometers. In one example, the output nanotrack 104c is disposed about a central portion 116 of the connector nanotrack 114. A length of the central portion 116 of the connector nanotrack 114 is about the same as the width of the output nanotrack 104c. In some examples, this is of the order of about 60-80 nanometers. This results in a smaller left portion 118 of the connector nanotrack 114 which couples to the first input nanotrack 104a, as compared to the length of the central portion 116. Similarly, this results in a smaller right portion 120 of the connector nanotrack 114 which couples to the second input nanotrack 104b, as compared to the length of the central portion 116.

Nucleating devices 106a, and 106b are disposed about the first end of the nanotracks 104a, and 104b respectively. For example, nucleating device 106a is disposed about the first end 110a of the first input nanotrack 104a. Nucleating device 106b is disposed about the first end 110b of the second input nanotrack 104b. In one example, the nucleating devices are magnetic tunnel junction devices. By selectively passing current through the nucleating devices, a SAF skyrmion is nucleated about the first end of the input nanotracks. In one example, presence of the SAF skyrmion is indicative of a first value, for example, a value of 1 and absence of the SAF skyrmion is indicative of a second value, for example, a value of 0. In this example, the nucleating device 106a sets the input value for input A, and nucleating device 106b sets the input value for input B.

Figure 1A:
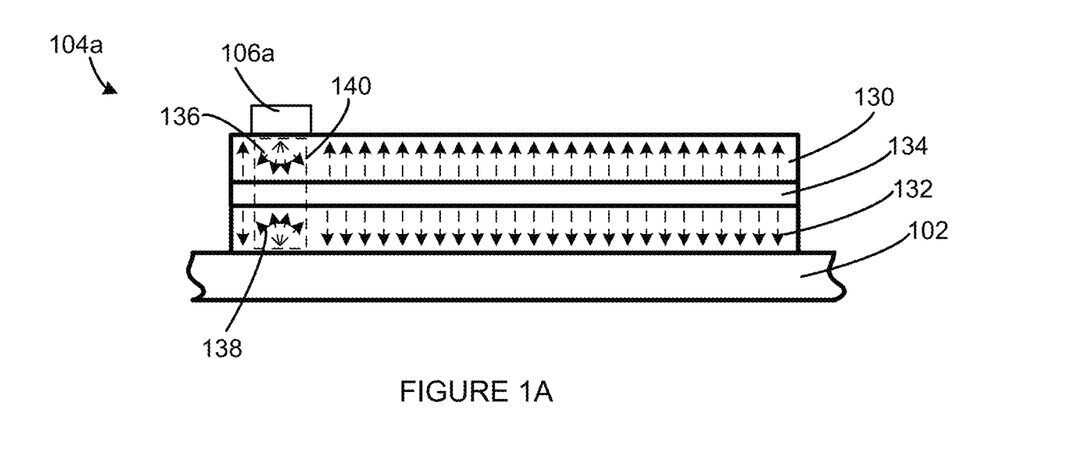
FIG. 1A shows partial cross-sectional view of the logic device of FIG. 1, along the Y-Y' axis, according to one aspect of the present disclosure.

In one example, the Nucleating devices 106a, and 106b are disposed about the top ferromagnetic layer 130, about the first end of the nanotracks 104a, and 104b respectively. For example, nucleating device 106a is disposed about the first end 110a of the first input nanotrack 104a. By selectively passing current through the nucleating devices, a first skyrmion 136 is selectively nucleated in the top ferromagnetic layer 130. A second skyrmion 138 is selectively nucleated in the bottom ferromagnetic layer 130, due to anti-ferromagnetic coupling between the top ferromagnetic layer 130 and the bottom ferromagnetic layer 132. The pair of the first skyrmion and the second skyrmion together form the SAF skyrmion 140.

Skyrmions are topologically protected magnetic configurations observed in magnets lacking inversion symmetry. Their topological protection comes from nonzero winding number. This result in their robustness against thermal fluctuations and disorder. Magnetic skyrmions are technologically intriguing due to their small size (typically less than 10 nm), ultra low currents required for their manipulation, for example, selective movement inside the nanotracks. They have large annihilation energy barrier (annihilation energy Ea>50 $k_B$T, where $k_B$ is Boltzmann constant and T is temperature. This large annihilation energy barrier can result in lifetimes greater than 10 years, generally suitable for device applications.

Skyrmions are stabilized by the presence of Dzyaloshinskii-Moriya interactions (DMIs) observed in chiral magnets or at the ferromagnet/heavy metal layer (FM-HM layer) interface. The interfacial spin orbit interaction give rise to DMI interaction at the FM-HM layer interface and is responsible for the stabilization of skyrmion bits in the ferromagnet. The same interfacial spin orbit interaction is responsible for spin Hall effect in the heavy metal layer. Further, in the proposed design the skyrmions are confined to the ferromagnet nanotracks due to edge repulsion. The skyrmion bits are nucleated by passing current through the magnetic tunnel junction positioned at each of the input nodes. The skyrmions are propagated through the spin orbit torque resulting from the x-polarized electrons accumulated at the ferromagnet/heavy metal layer interface when the charge current Ic flows in the y-direction in the heavy metal layer. In this example, the second skyrmion moves due to the spin orbit torque and the first skyrmion moves along with the second skyrmion, due to antiferromagnetic coupling between the first skyrmion and the second skyrmion.

In general, magnetic skyrmion is a stable nano sized spin configurations with topological property that is locally nucleated by injection of spin-polarized current and displaced in the ferromagnet nanotrack by current-induced spin torques. In this example, due to the antiferromagnetic coupling between the first skyrmion and the second skyrmion, the SAF skyrmion does not exhibit a skyrmion hall effect, which tends to bias the movement of the skyrmion along the nanotrack, instead the SAF skyrmion will move substantially along the length of the nanotrack.

The sense device 108 is selectively disposed about the second end 112b of the output nanotrack 104b. The sense device 108 is configured to sense the presence of the skyrmion about the second end of the middle nanotrack 104b. In one example, presence of the skyrmion is indicative of a first value, for example, a value of 1 and absence of the skyrmion is indicative of a second value, for example, a value of 0. In some examples, the sense device 108 is a magnetic tunnel junction device.

When a charge current Ic is passed through the substrate 102, nucleated skyrmions are configured to travel towards the second end of the nanotrack. In one example, the charge current Ic is passed along the Y axis and the skyrmions will move along the Y axis. The skyrmion move along the Y axis, due to the spin orbit torque resulting from polarized electrons accumulated about the ferromagnet-heavy metal layer interface when the charge current Ic flows in the heavy metal layer. Further, the skyrmions are confined to the nanotracks due to edge repulsion. Unlike single skyrmions, the SAF skyrmions do not have a tendency to be biased to shift along the −X direction, but rather move towards the second end of the nanotrack, along the Y direction. Further, strong exchange coupling between the first skyrmion and the second skyrmion permits the SAF skyrmions to move faster than single skyrmions. In some examples, the absence of stray field in the SAF skyrmion permits the use of smaller SAF skyrmions. SAF skyrmions may be of the order of about less than 10 nm as compared to ferromagnet skyrmions which may be of the order of 20 nm or higher. In some examples, this characteristic permits construction of a logic device that operates at a faster rate. In some examples, the velocity of travel of the SAF skyrmion may be of the order of about 500 m/sec to about 1000 m/sec, as compared to less than about 100 m/sec for non SAF skyrmions like ferromagnet skyrmions. Further details about the selective movement of the nucleated skyrmions along the nanotracks will be later described with reference to FIGS. 2B to 2H.

Figure 2A:
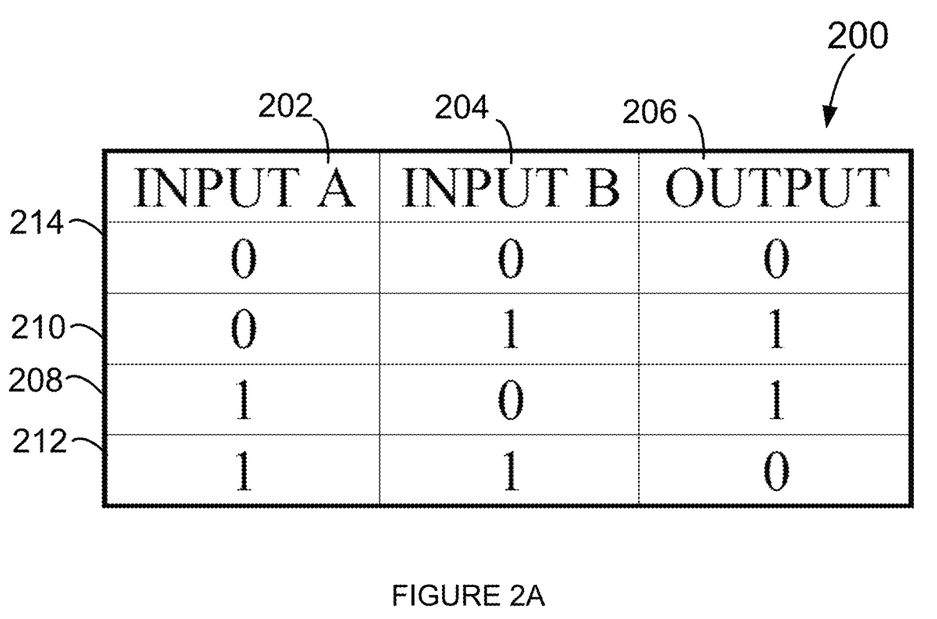
FIG. 2A shows an example truth table for a two input logic device, according to one aspect of the present disclosure.

FIG. 2A shows an example truth table 200 for a two input logic device, according to an example of this disclosure. Referring now to table 200, Input A is shown in column 202, input B is shown in column 204, and output is shown in column 206. In this example, the truth table 200 corresponds to an exclusive OR configuration of the logic device. For example, referring to rows 208 and 210, when only one of the inputs A or B is a 0, the output is 1. Similarly, referring to row 212, if both the inputs are a 1, the output is a 0. Similarly, referring to row 214 when both the inputs are a zero, output is a 0. As previously described, presence of a skyrmion at the input is indicative of a value of 1 and absence of a skyrmion at the input is indicative of a value of 0. Further, presence of a skyrmion at the output is indicative of a value of 1 and absence of a skyrmion at the output is indicative of a value of 0. Now, referring to FIGS. 2B to 2H, selective movement of the skyrmion from the first end of the nanotrack to the second end of the nanotrack is now described, for various combinations of input values.

Figure 2B:
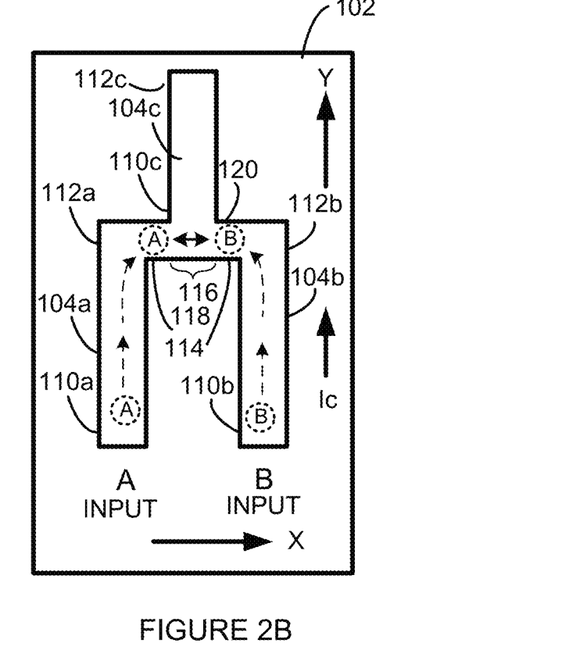
FIGS. 2B to 2D show selective movement of the SAF skyrmion from the first end of the nanotrack to the second end of the nanotrack, for various combinations of input values shown in the truth table of FIG. 2A, according to one aspect of the present disclosure.

Now, referring to FIG. 2B, logic device 100 is shown with input values A, and B set as 1, 1 respectively, at the first end of the first input nanotrack 104a and the second input nanotrack 104b. As previously described, a SAF skyrmion is selectively nucleated at inputs A, and B. Nucleated SAF skyrmion at input A, and B are shown as SAF skyrmion A, and SAF skyrmion B. When charge current Ic is passed in the +Y direction, the SAF skyrmions will move towards the second end of the nanotracks, along the Y axis. As previously described, the SAF skyrmions do not have a tendency to be biased to move in the −X direction, as they move towards the second end of the nanotrack, but rather move substantially along the Y axis.

As SAF skyrmion A and SAF skyrmion B moves towards the second end, they both approached the connector nanotrack 114. SAF Skyrmion A will be repelled by the edges of the first input nanotrack 104a and is pushed towards the left portion 118 of the connector nanotrack 114. In the meantime, SAF skyrmion B moves towards the second end 112b of the second input nanotrack 104b. SAF Skyrmion B will be repelled by the edges of the second input nanotrack 104b and is pushed towards the right portion 120 of the connector nanotrack 104b. As both SAF skyrmoin A and SAF skyrmion B try to enter the central portion 116 of the connector nanotrack 114, they repel each other and neither of the SAF skyrmion A and SAF skyrmion B enter the output nanotrack 104c. When the charge current Ic is stopped, both SAF skyrmion A and SAF skyrmion B will be disposed about the connector nanotrack 114. And, no SAF skyrmion is present at the second end 112c of the output nanotrack 104c.

As previously described, the output is measured by the sensor disposed about the second end 112c of the output nanotrack 104c. In this example, we notice that no skyrmion is disposed at the second end 112c of the output nanotrack 104c. As there is no skyrmion is present at the second end 112c of the output nanotrack 104c, the sensor will detect the absence of the skyrmion and yield a value of 0. This result is consistent with the result expected according to row 212 of the truth table 200 of FIG. 2A.

Figure 2C:
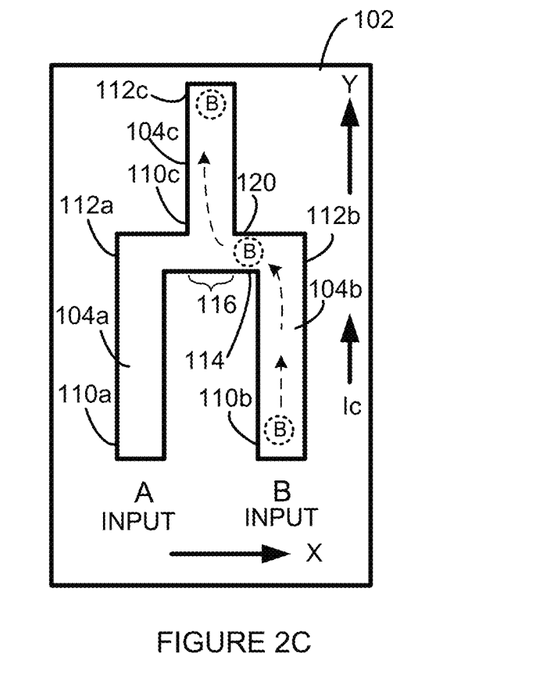

Now, referring to FIG. 2C, logic device 100 is shown with input values A, and B are set as 0, 1 respectively, at the first end of the first input nanotrack 104a and the second input nanotrack 104b. As previously described, a SAF skyrmion is selectively nucleated at input B. Nucleated SAF skyrmion at input B is shown as SAF skyrmion B. When charge current Ic is passed in the +Y direction, the SAF skyrmion B will move towards the second end 112b of the second input nanotrack 104b, along the Y axis. As previously described, the SAF skyrmions do not have a tendency to be biased to move in the −X direction, as they move towards the second end of the nanotrack, but rather move substantially along the Y axis.

As SAF skyrmion B moves towards the second end, it approaches the connector nanotrack 114. SAF Skyrmion B will be repelled by the edges of the second input nanotrack 104b and is pushed towards the right portion 120 of the connector nanotrack 104b. As input A is zero, no corresponding skyrmion is moving in the first input nanotrack 104a. Therefore, SAF skyrmion B will shift from second input nanotrack 104b to output nanotrack 104c through the connector nanotrack 114 and continues to move towards the second end 112c of the output nanotrack 104c and eventually reach the second end 112c of the output nanotrack 104c.

As previously described, the output is measured by the sensor disposed about the second end 112c of the output nanotrack 104c. In this example, we notice that the SAF skyrmion B is now disposed at the second end 112c of the output nanotrack 104c. As there is a skyrmion present at the second end 112c of the output nanotrack 104c, the sensor will detect the presence of the SAF skyrmion and yield a value of 1. This result is consistent with the result expected according to row 210 of the truth table 200 of FIG. 2A.

Figure 2D:
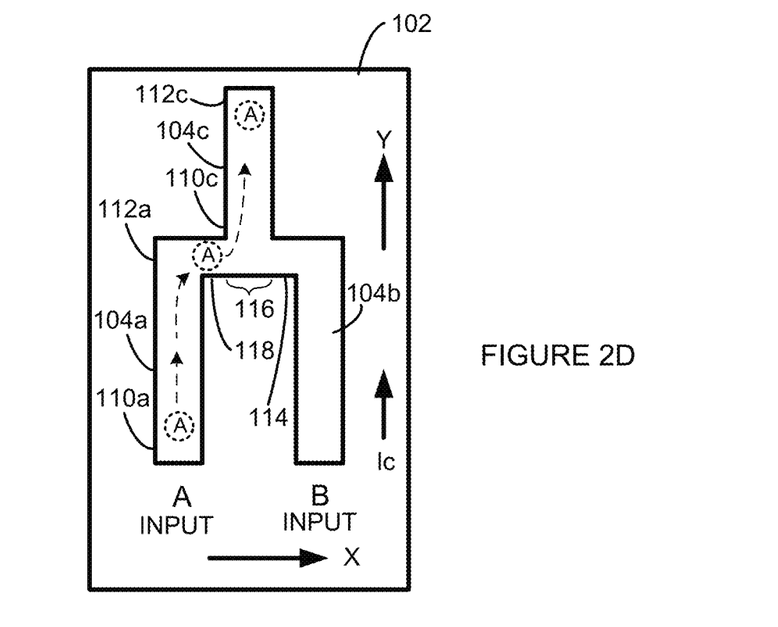

Now, referring to FIG. 2D, logic device 100 is shown with input values A, and B set as 1, 0 respectively, at the first end of the first input nanotrack 104a and second input nanotrack 104b. As previously described, a SAF skyrmion is selectively nucleated at input A. Nucleated SAF skyrmion at input A is shown as skyrmion A. When charge current Ic is passed in the +Y direction, the SAF skyrmion A will move towards the second end 112a of the first input nanotrack 104a, along the Y axis. About the second end 112a of the first input nanotrack 104a, skyrmion A will be repelled by the edges of the first input nanotrack 104a and is pushed towards the left portion 118 of the connector nanotrack 114.

SAF skyrmion A moves into the left portion 118 of the connector nanotrack 114. As input B is zero, no corresponding skyrmion is moving in the second input nanotrack 104b. Therefore, SAF skyrmion A will shift from first input nanotrack 104a to output nanotrack 104c through the connector nanotrack 114 and continues to move towards the second end 112c of the output nanotrack 104c and eventually reaches the second end 112c of the output nanotrack 104c.

As previously described, the output is measured by the sensor disposed about the second end 112c of the output nanotrack 104c. In this example, we notice that the skyrmion A is now disposed at the second end 112c of the output nanotrack 104c. As there is a skyrmion present at the second end 112c of the output nanotrack 104c, the sensor will detect the presence of the skyrmion and yield a value of 1. This result is consistent with the result expected according to row 208 of the truth table 200 of FIG. 2A.

When the input values A, and B are set as 0, 0 respectively, at the first end of the first input nanotrack 104a and the second input nanotrack 104b, no skyrmions are present at the first input nanotrack 104a and the second input nanotrack 104b. When the charge current Ic is passed, there will be no skyrmions at the second end of the output nanotrack 104c. As no skyrmion is detected at the output, the sensor will detect the absence of the skyrmion and yield a value of 0. This result is consistent with the result expected according to row 214 of the truth table 200 of FIG. 2A.

Figure 3A:
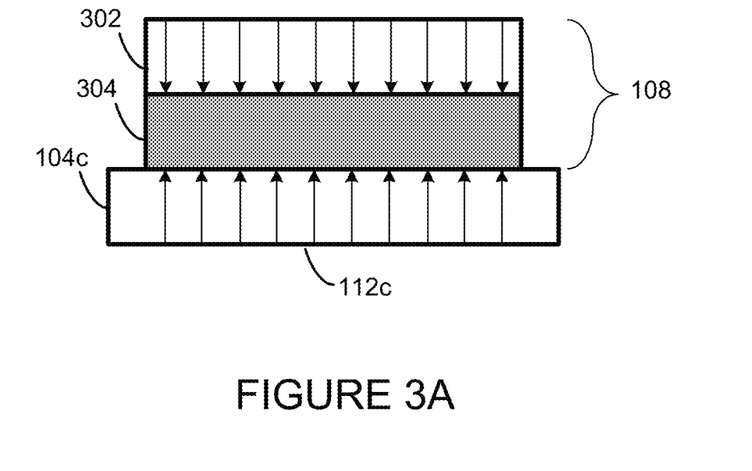
FIGS. 3A and 3B show structure and operation of an example sensor, according to one aspect of the present disclosure.
Figure 3B:
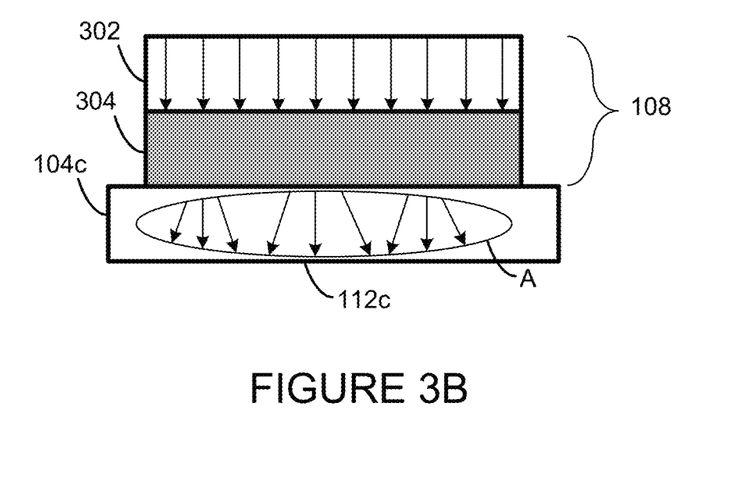

Now, referring to FIGS. 3A and 3B, example structure and operation of the sensor 108 is described. Referring to FIG. 3A, the sensor 108 includes an output ferromagnetic layer 302 and a sensor spacer layer 304. The sensor 108 is disposed over the output nanotrack 104c, about the second end 112c. The magnetic orientation of the output ferromagnetic layer 302 is pinned such that the direction of the magnetic orientation of the output ferromagnetic layer 302 (as shown by arrows in the output ferromagnetic layer 302) is antiparallel to that of the ferromagnetic output nanotrack 104c (as shown by arrows in the ferromagnetic output nanotrack 114c). This combination structure of the output ferromagnetic layer 302, sensor spacer layer 304 and the second end 112c portion of the output nanotrack 104c acts as a magnetic tunnel junction stack. In some examples, the output ferromagnetic layer 302 may be a CoFe alloy or a CoFeB alloy. The sensor spacer layer 304 may be a MgO (Magnesium Oxide) layer. In some examples, a thickness of the output ferromagnetic layer 302 may be of the order of about 1-2 nanometers. In some examples, the sensor spacer layer 304 may be of the order of about 1 nanometer.

When no skyrmion is present about the second end 112c of the output nanotrack 104c, due to the antiparallel magnetic orientation, the resistance across the magnetic tunnel junction will be high. In one example, this indicates the absence of the skyrmion about the second end 112c of the output nanotrack 104c.

Now referring to FIG. 3B, when a skyrmion, for example, SAF skyrmion A is present about the second end 112c of the output nanotrack 104c, direction of some of the magnetic orientation inside the skyrmion will be parallel or quasi-parallel to the pinned direction of magnetic orientation inside the output ferromagnetic layer 302 (as shown by arrows inside the skyrmion A). Due to the quasi-parallel magnetic orientation, the resistance across the magnetic tunnel junction will be low. In one example, this indicates the presence of the skyrmion about the second end 112c of the output nanotrack 104c.

Figure 4:
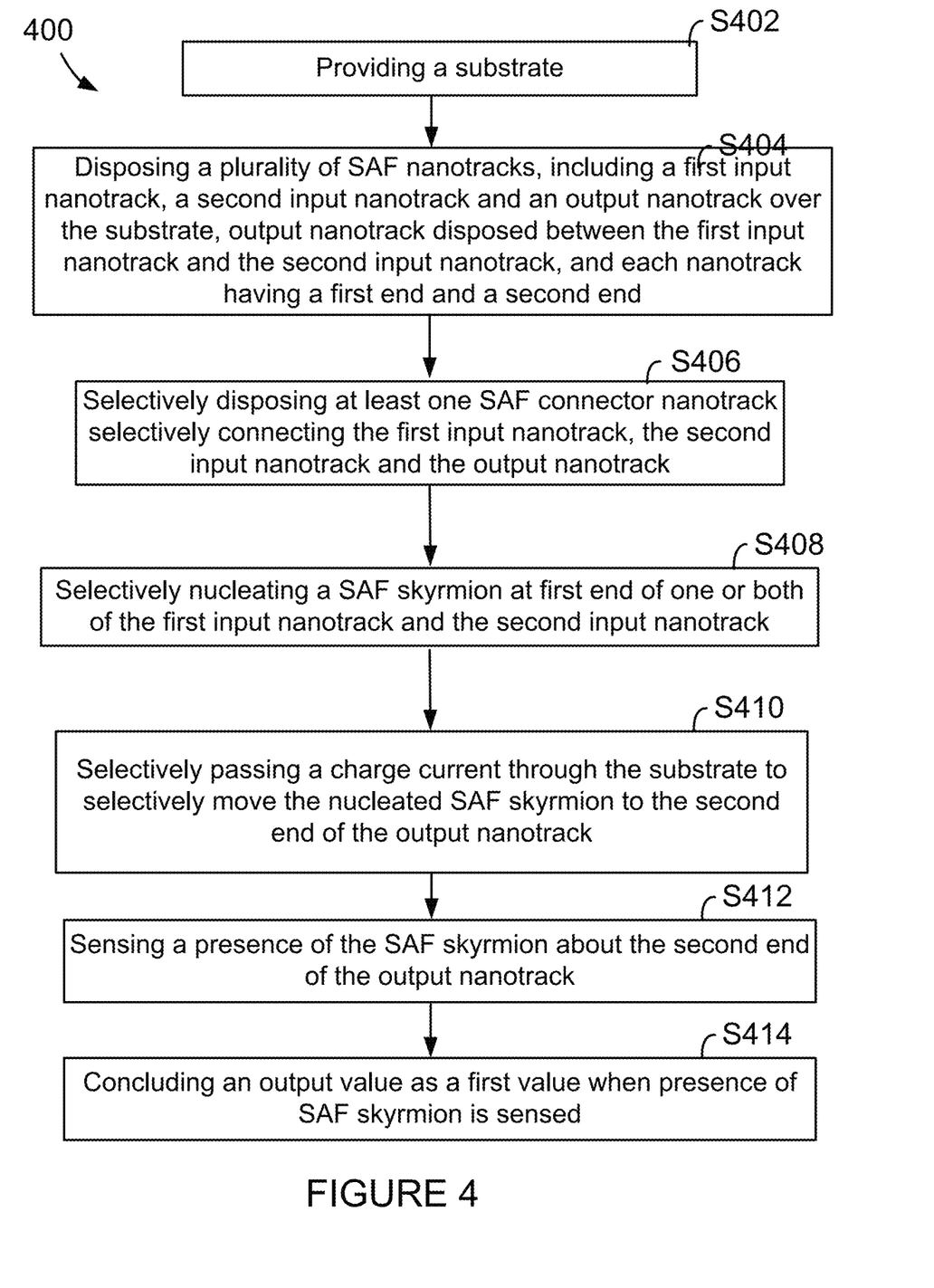
FIG. 4 shows an example flow diagram, according to one aspect of the present disclosure.

Now, referring to FIG. 4, an example flow diagram 400 is described. In block S402, a substrate is provided. For example, substrate 102 is provided.

In block S404, a plurality of SAF nanotracks including a first input nanotrack, a second input nanotrack, and an output nanotrack are disposed over the substrate. The output nanotrack is disposed between the first input nanotrack and the second input nanotrack. Each of the nanotracks have a first end and a second end. For example, first input nanotrack 104a, second input nanotrack 104b and output nanotrack 104c are provided. Each nanotrack has a first end and a second end. For example, first input nanotrack 104a has a first end 110a and a second end 112a. The second input nanotrack 104b has a first end 110b and a second end 112b. The output nanotrack 104c has a first end 110c and a second end 112c.

In block S406, at least one SAF connector nanotrack is selectively disposed to connect the first input nanotrack, the second input nanotrack and the output nanotrack. For example, connector nanotrack 114 is disposed between the first input nanotrack 104a and the second input nanotrack 104b.

In block S408, a SAF skyrmion is selectively nucleated at the first end of one or both of the first input nanotrack and second input nanotrack. Various combinations of selectively nucleating one or more SAF skyrmions was previously described with reference to FIGS. 2B-2D. For example, referring to FIG. 2B, logic device 100 was shown with input values A, and B set as 1, 1 respectively, at the first end of the first input nanotrack 104a and second input nanotrack 104b. As previously described, a SAF skyrmion is selectively nucleated at inputs A, and B. Nucleated SAF skyrmion at input A, and B are shown as skyrmion A, and skyrmion B. When charge current Ic is passed in the +Y direction, the SAF skyrmions will move towards the second end of the input nanotracks, along the Y axis.

In block S410, a charge current Ic selectively passed through the substrate to selectively move the nucleated SAF skyrmion to the second end of the output nanotrack 104c. As previously described with reference to FIGS. 2B-2D, when charge current Ic is passed in the +Y direction, the skyrmions will move towards the second end of the output nanotrack 104c, along the Y axis.

In block S412, a presence of the SAF skyrmion is sensed about the second end of the output nanotrack. For example, presence of the SAF skyrmion is sensed about the second end 112c of the output nanotrack 104c.

In block S414, concluding an output value as a first value, when the presence of the SAF skyrmion is sensed. For example, presence of the SAF skyrmion about the second end of the output nanotrack 104c is indicative of an output of first value.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that phraseology or terminology employed herein is for the purpose of description and not of limitation.

While embodiments of the present invention are described above with respect to what is currently considered its preferred embodiments, it is to be understood that the invention is not limited to that described above. To the contrary, the invention is intended to cover various modifications and equivalent arrangements within the spirit and scope of the appended claims.

What is claimed is:

1. A method, including:
   providing a substrate;
   disposing a plurality of synthetic antiferromagnet (SAF) nanotracks along a first axis, with at least a first input nanotrack, a second input nanotrack and an output nanotrack over the substrate, the output nanotrack disposed between the first input nanotrack and the second input nanotrack, each first input nanotrack and second input nanotrack further having a first end and a second end; disposing at least one connector nanotrack about the second end of the first input nanotrack, the second end of the second input nanotrack, and the first end of the output nanotrack, the at least one connector nanotrack selectively connecting the first input nanotrack, the second input nanotrack and the output nanotrack, wherein, the connector nanotrack provides a path for the nucleated SAF skyrmion to move through the output nanotrack;
      each first input nanotrack, second input nanotrack, output nanotrack, and the connector nanotrack having a top ferromagnetic layer, a bottom ferromagnetic layer and a spacer layer disposed between the top ferromagnetic layer and the bottom ferromagnetic layer, and further, the bottom ferromagnetic layer disposed over the substrate;
   selectively defining an input value at the first end of the first input nanotrack and the second input nanotrack by selectively nucleating a SAF skyrmion at the first end of one or both of the first input nanotrack and the second input nanotrack, wherein presence of the SAF skyrmion indicative of a first value and absence of the SAF skyrmion indictive of a second value;
   selectively passing a charge current through the substrate to selectively move the nucleated SAF skyrmion towards the second end of the output nanotrack, charge current passed along the first axis;
   sensing the presence of the SAF skyrmion about the second end of the output nanotrack; and concluding an output value as the first value when the presence of the SAF skyrmion is sensed, wherein the SAF skyrmion selectively moving from the first end to the second end of one of the first input nanotrack and the second input nanotrack selectively shifts to the output nanotrack through the connector track, unless both the first input nanotrack and the second input nanotrack have nucleated SAF skyrmion.

2. The method of claim 1, wherein, at least one SAF skyrmion in one of the first nanotrack and the second nanotrack moves to the output nanotrack, via the connector nanotrack.

3. The method of claim 1, wherein, the charge current is passed through the substrate in a first direction, the nucleated SAF skyrmion selectively moves in the first direction due to a spin orbit torque generated in a second direction orthogonal to the first direction.

4. The method of claim 1, further including,
   selectively disposing at least one nucleating device adjacent the first end of the first input nanotrack and the first end of the second input nanotrack, about the top ferromagnetic layer; and selectively energizing the nucleating device to selectively nucleate a first skyrmion in one or both of the top ferromagnetic layer of the first input nanotrack and the second input nanotrack to indicate the input value, a second skyrmion induced in the bottom ferromagnetic layer of the first input nanotrack and the second input nanotrack corresponding to the first skyrmion, the first skyrmion and the second skyrmion pair together forming the SAF skyrmion.

5. The method of claim 1, further including,
   selectively disposing at least one sensing device adjacent the second end of the output nanotrack to selectively sense the presence of the SAF skyrmion about the second end of the output nanotrack.

6. The method of claim 5, the sensing device includes an output ferromagnetic layer and a sensor spacer layer, the sensor spacer layer disposed between the output ferromagnetic layer and the second end of the output nanotrack, the output ferromagnetic layer, the sensor spacer layer and a portion of the second end of the output nanotrack forming a magnetic tunnel junction stack.

7. The method of claim 1, wherein the movement of the SAF skyrmion is constrained by the walls of the nanotracks.

8. A system, including:
   a substrate;
   a plurality of synthetic antiferromagnetic (SAF) nanotracks along a first axis, with at least a first input nanotrack, a second input nanotrack and an output nanotrack disposed over the substrate, the output nanotrack disposed between the first input nanotrack and the second input nanotrack, each nanotrack having a first end and a second end;
   at least one connector nanotrack is disposed about the second end of the first input nanotrack, the second end of the second input nanotrack, and the first end of the output nanotrack, the at least one connector nanotrack selectively connects the first input nanotrack, the second input nanotrack and the output nanotrack, wherein, the connector nanotrack provides a path for the nucleated SAF skyrmion to move through the output nanotrack;
      each first input nanotrack, second input nanotrack, output nanotrack, and the connector nanotrack having a top ferromagnetic layer, a bottom ferromagnetic layer and a spacer layer disposed between the top ferromagnetic layer and the bottom ferromagnetic layer, and further, the bottom ferromagnetic layer disposed over the substrate;
   an input value at the first end of the first input nanotrack and the second input nanotrack is selectively defined by selectively nucleating a SAF skyrmion at the first end of one or both of the first input nanotrack and the second input nanotrack, wherein presence of the SAF skyrmion indicative of a first value and absence of the skyrmion indictive of a second value;

a charge current is selectively passed through the substrate to selectively move the nucleated SAF skyrmion towards the second end of the output nanotrack, shift current passed along a second axis, second axis substantially perpendicular to the first axis;

the presence of the SAF skyrmion is sensed about the second end of the output nanotrack; and an output value is concluded as the first value when the presence of the SAF skyrmion is sensed, wherein the SAF skyrmion selectively moves from the first end to the second end of one of the first input nanotrack and the second input nanotrack, and selectively shifts to the output nanotrack through the connector track, unless both the first input nanotrack and the second input nanotrack have nucleated SAF skyrmion.

9. The system of claim 8, wherein, at least one SAF skyrmion in one of the first nanotrack and the second nanotrack moves to the output nanotrack, via the connector nanotrack.

10. The system of claim 8, wherein, the charge current is passed through the substrate in a first direction and the nucleated SAF skyrmion selectively moves in the first direction due to a spin orbit torque generated in a second direction orthogonal to the first direction.

11. The system of claim 8, further including,
at least one nucleating device is selectively disposed adjacent the first end of the first input nanotrack and the first end of the second input nanotrack, about the top ferromagnetic layer; and the nucleating device is selectively energized to selectively nucleate a first skyrmion in one or both of the top layer of the first input nanotrack and the second input nanotrack to indicate the input value, a second skyrmion induced in the bottom ferromagnetic layer of the first input nanotrack and the second input nanotrack corresponding to the first skyrmion, the first skyrmion and the second skyrmion pair together form the SAF skyrmion.

12. The system of claim 8, further including,
at least one sensing device is selectively disposed adjacent the second end of the output nanotrack to selectively sense the presence of the SAF skyrmion about the second end of the output nanotrack.

13. The system of claim 12, the sensing device includes an output ferromagnetic layer and a sensor spacer layer, the sensor spacer layer disposed between the output ferromagnetic layer and the second end of the output nanotrack, the output ferromagnetic layer, the sensor spacer layer and a portion of the second end of the output nanotrack together form a magnetic tunnel junction stack.

14. The system of claim 8, wherein the movement of the SAF skyrmion is constrained by the walls of the nanotracks.

* * * * *